United States Patent [19]
Matsuo et al.

[11] Patent Number: 5,744,838
[45] Date of Patent: Apr. 28, 1998

[54] SEMICONDUCTOR DEVICE HAVING INTERNAL CIRCUIT OTHER THAN INITIAL INPUT STAGE CIRCUIT

[75] Inventors: Ryuichi Matsuo; Kenji Anami, both of Hyogo, Japan

[73] Assignee: Mitsubishi Denki Kabushiki Kaisha, Tokyo, Japan

[21] Appl. No.: 455,243

[22] Filed: May 31, 1995

[30] Foreign Application Priority Data

Sep. 27, 1994 [JP] Japan .................. 6-231045

[51] Int. Cl.$^6$ .................................................. H01L 23/62
[52] U.S. Cl. .................. 257/356; 257/355; 257/560
[58] Field of Search .................... 257/356, 355, 257/358, 360

[56] References Cited

U.S. PATENT DOCUMENTS

| | | | |
|---|---|---|---|
| 5,270,565 | 12/1993 | Lee et al. | 257/356 |
| 5,483,093 | 1/1996 | Murakami | 257/356 |
| 5,567,968 | 10/1996 | Tsurita et al. | 257/356 |

FOREIGN PATENT DOCUMENTS

| | | |
|---|---|---|
| 2-78230 | 3/1990 | Japan . |
| 3-104159 | 5/1991 | Japan . |
| 4-158578 | 6/1992 | Japan . |
| 4-291944 | 10/1992 | Japan . |
| 223705 | 5/1994 | Taiwan . |
| 226476 | 7/1994 | Taiwan . |
| 130915 | 7/1995 | Taiwan . |

OTHER PUBLICATIONS

Duvvury et al, "Input Protection Design for Overall Chip Reliability", EOS/ESD Symposium Proceedings, 1989, pp. 190–197.

*Primary Examiner*—Mahshid D. Saadat
*Assistant Examiner*—S. V. Clark
*Attorney, Agent, or Firm*—Lowe, Price, LeBlanc & Becker

[57] ABSTRACT

Obtained is a semiconductor device which can effectively prevent a gate oxide film from deterioration or breaking caused by plasma charged particles which are accumulated in a wiring layer in plasma etching thereof, even if an antenna ratio is increased. In this semiconductor device, an impurity diffusion layer forming a resistor and a diode is interposed between a gate electrode layer of a field-effect transistor of an internal circuit other than an initial input stage circuit and a first wiring layer for transmitting a circuit signal to the gate electrode layer. Thus, plasma charged particles which are accumulated in the first wiring layer in plasma etching thereof are absorbed by the impurity diffusion layer, whereby no surge voltage is applied to the gate electrode layer which is connected with the first wiring layer. Thus, the gate oxide film which is positioned under the gate electrode layer is prevented from breaking or deterioration.

14 Claims, 17 Drawing Sheets

SEMICONDUCTOR DEVICE HAVING INTERNAL CIRCUIT OTHER THAN INITIAL INPUT STAGE CIRCUIT

BACKGROUND OF THE INVENTION

1. Field of the Invention

The present invention generally relates to a semiconductor device, and more particularly, it relates to a semiconductor device including an internal circuit other than an initial input stage circuit, which has a field-effect transistor.

2. Description of the Background Art

In general, an input protection circuit is employed for preventing deterioration or breaking of a gate oxide film of a MOS transistor forming a logic circuit of an initial input stage. FIGS. 22 and 23 are equivalent circuit diagrams showing conventional NMOS transistor type and diode type input protection circuits which are employed for MOS logic circuits of initial input stages respectively.

Referring to FIG. 22, a first end of a resistor 103 is connected to an input terminal a of the conventional NMOS transistor type input protection circuit. A source/drain region of an NMOS transistor 104 is connected to a second end of the resistor 13, while another source/drain region thereof is grounded. An end of a resistor 103a is connected to a gate electrode of the NMOS transistor 104, while another end thereof is grounded. The second end of the resistor 103 is connected with an initial input stage logic circuit 105.

Referring to FIG. 23, a first end of a resistor 103 is connected to an input terminal a in the conventional diode type input protection circuit. A second end of the resistor 103 is connected with first ends of diodes 106 and 107. A second end of the diode 106 is connected to a Vcc power source 101, while that of the diode 107 is grounded. The second end of the resistor 103 is connected with an initial input stage logic circuit 105.

With reference to FIG. 22, the operation of the conventional NMOS transistor type input protection circuit is described. It is assumed that a plus or minus surge voltage of several 100 to several 1000 V is applied to the input terminal a. The resistor 103 is set at several 100 Ω, in order to suppress a peak value of the surge voltage. On the other hand, the resistor 103a is set at several Ω. When a plus surge voltage is inputted in the input terminal a, the resistor 103 suppresses the peak value of this surge voltage. At the same time, the gate electrode of the NMOS transistor 104 floats due to capacitive coupling, whereby the NMOS transistor 104 instantaneously enters an ON state. Thus, the surge voltage is extracted to the ground 102. When a minus surge voltage is inputted in the input terminal a, on the other hand, the resistor 103 reduces the peak value of this surge voltage. At the same time, the NMOS transistor 104 enters an ON state similarly to the above. Further, an N-type diffusion layer (diode) forming a drain region of the NMOS transistor 104 supplies a GND level voltage. Thus, the surge voltage is further reduced.

The conventional diode type input protection circuit is now described with reference to FIG. 23. When a plus or minus surge voltage is inputted in the input terminal a, the resistor 103 reduces the peak value of this surge voltage. When a plus surge voltage is applied, this surge voltage flows to the Vcc power source 101 through the diode 106. When a minus surge voltage is applied, on the other hand, the diode 107 supplies a GND level voltage, thereby further reducing the surge voltage. Thus, each of the input protection circuits shown in FIGS. 22 and 23 prevents a gate oxide film of the initial input stage logic circuit 105 from deterioration or breaking by reducing the absolute value of the surge voltage.

FIG. 24 is a plan view showing a plane pattern of the conventional NMOS transistor type input protection circuit shown in FIG. 22. Referring to FIG. 24, a glass-coated window 108 is provided on a bonding pad 118 consisting of a metal. A bonding wire 109 is connected to the bonding pad 118 through the glass-coated window 108, for connecting the circuit with an external lead wire a. The bonding pad 118 is electrically connected with the resistor 103, which is formed by a polysilicon film or the like, through a contact hole 110. The resistor 103 is connected with a metal wire 119, which consists of aluminum or the like, through a contact hole 111. The metal wire 119 is connected with a source/drain region 116 through contact holes 112. Another source/drain region 115 is connected with a metal wire 130 through contact holes 114. A gate electrode layer 135 consisting of polysilicon or the like is connected with the metal wire 130 through a contact hole 113.

As hereinabove described, the input protection circuit is generally provided in order to prevent the gate oxide film of the initial input stage logic circuit including a MOS transistor from deterioration or breaking.

In general, however, no protection circuit is provided for an internal circuit other than an initial input stage circuit. No protection circuit has been regarded as necessary for such an internal circuit other than the initial input stage circuit, since no surge voltage is applied thereto from an external input.

However, it has been found that a gate oxide film of an internal logic circuit is deteriorated when its thickness is reduced for improving transistor performance. Such deterioration of the gate oxide film remarkably appears when its thickness is reduced below about 100 Å. This deterioration is conceivably caused by the following reason: In a fabrication process, a prescribed layer is patterned by plasma etching. A plasma which is employed in the plasma etching is accumulated in the patterned layer as plasma charged particles, and hence the patterned layer is charged up. When the layer as charged up is connected to a gate electrode layer of a MOS transistor which is included in the internal circuit, a surge voltage is applied to the gate electrode layer. Thus, a gate oxide film which is located under the gate electrode layer is disadvantageously deteriorated or broken. This phenomenon remarkably takes place with increase in sum of areas of regions of the gate electrode layer other than a channel portion and the patterned layer (metal wiring layer) which is connected to the gate electrode layer. This is because the amount of the plasma charge particles charging the patterned layer and the gate electrode layer is increased as the aforementioned sum of areas is increased.

FIG. 25 is a plan view showing a plane pattern of a conventional internal circuit 150 other than an initial input stage circuit, including a MOS transistor. Referring to FIG. 25, it is assumed that the internal circuit 150 is formed by only one MOS transistor, for simplifying the illustration. This internal circuit 150 is connected with a precedent stage internal circuit 200 by a metal wire 20 which is formed by an aluminum wiring layer or the like. In more concrete terms, the metal wire 20 is connected to a gate electrode layer 23 which is formed by a polysilicon layer or the like through a contact hole 29. Source/drain regions 26 and 27 are formed by impurity diffusion layers or the like at a prescribed distance from each other, to hold the gate electrode layer 23 therebetween. The source/drain region 26 is connected with a metal wire 21 which is formed by an aluminum wiring layer or the like through contact holes 24. On the other hand, the source/drain region 27 is connected with a metal wire 22 which is formed by an aluminum wiring layer or the like through contact holes 25. FIG. 26 is an equivalent circuit diagram of the plane pattern shown in FIG. 26.

In general, plasma etching is employed for patterning the metal wire 20. At this time, a plasma is accumulated in the patterned metal wire 20, which in turn is charged up. Plasma charged particles charging up the metal wire 20 flow into the gate electrode layer 23, which is electrically connected with the metal wire 20. Thus, a surge voltage is applied to the gate electrode layer 23, whereby stress is applied to a gate oxide film which is located on a channel portion 28 located under the gate electrode 28 by the surge voltage. Thus, the gate oxide film is disadvantageously deteriorated or broken.

A ratio of an area of a conductive layer, in which plasma charged particles generated in plasma etching are accumulated, to that of a gate oxide film is called an antenna ratio. Consider the antenna ratio in the plane pattern shown in FIG. 25. The channel portion 28 provided with the gate oxide film has an area of 1 μm (channel length)×7 μm (channel width)=7 μm$^2$, that of the gate electrode layer 23 excluding the channel portion 28 is 2 μm×2 μm+(1 μm×1 μm)×2 μm=6 μm$^2$, and that of the metal wire 20 is 2 μm×5000 μm=10000 μm$^2$. In this case, the antenna ratio is (10000 μm$^2$+6 μm$^2$)/7 μm$^2$≈1430.

In a first stage of deterioration or breaking of the gate oxide film resulting from surge stress caused by plasma charges, the gate oxide film easily traps hot carriers and hence the threshold voltage of the transistor is increased. In a second stage of deterioration or breaking of the gate oxide film, a leakage current flows across the gate electrode layer and a substrate or the source/drain regions. This phenomenon is not yet widely known in general due to insufficient quantitative data.

FIG. 27 illustrates how fluctuation quantities of threshold voltages were varied with changes of antenna ratios in an experiment. Referring to FIG. 27, the axis of abscissas shows times and the axis of ordinates shows logarithmic values of the fluctuation quantities of the threshold voltages. This experiment was made under conditions of a channel length of 0.5 μm, a thickness ($T_{OX}$) of 120 Å of a gate oxide film, a gate voltage ($V_G$) of 2 V, a voltage ($V_{DS}$) of 5.5 V across source and drain regions, and an experimental temperature of −50° C. Referring to FIG. 27, it is understood that the fluctuation quantity of the threshold voltage is increased as the antenna ratio is increased. In other words, it is understood that hot carriers are easily trapped in the gate oxide film as the antenna ratio is increased.

It is extremely difficult to simply estimate the lifetimes of the gate oxide films from FIG. 27, for the following reason: While a dc voltage was applied to each gate electrode for making an acceleration experiment in this case, an input waveform for a gate electrode is switched to a high or low level in actual employment. Therefore, hot electrons are generated in a switching transition period (Tr or Tf), dissimilarly to the experimental condition. Further, the experiment under the temperature condition of −50° C. was at an acceleration rate of 10 to 100 times that under a temperature of 25° C. for actual employment.

Further, it is impossible to clearly limit the fluctuation level of the threshold voltage for deciding a failure. In a high-speed device, threshold voltage fluctuation of 0.03 to 0.05 V is critical for the device characteristics. In such a high-speed device whose threshold voltage $V_{TH}$ is set at 0.6 to 0.7 V, high-speed performance is reduced by at least 5% if the threshold voltage is shifted in excess of 5%, leading to a high possibility for a malfunction of the system. Therefore, a failure of a high-speed device is decided when the threshold voltage fluctuates by about 0.03 to 0.05 V. In a low-speed device, on the other hand, tolerance for an operating speed is sometimes about half the standard value, and no problem is caused in this case even if speed performance is reduced by several to several 10%. In such a low-speed device which is adapted to attain low current consumption in general, it may be rather desirable that the threshold voltage is increased to provide a low current. Thus, the tolerance for an antenna ratio must be decided in response to the performance which is required for the device.

Breaking of the gate oxide film is now studied. FIG. 28 is a correlation diagram showing a relation between an antenna ratio and a gate oxide film breaking rate. Referring to FIG. 28, a gate, a substrate and a source are grounded in this measurement, and the device is regarded as being broken when a leakage current of at least 1 μA flows from a drain. A thickness ($T_{OX}$) of a gate oxide film is set at 120 Å. It is understood that breaking of 0 to 20% is caused when the antenna ratio is 10$^3$. Thus, no problem is caused when the antenna ratio is not more than 10, and it is preferable to set the antenna ratio to be not more than about 5 for further allowance.

However, the chip size of a semiconductor device tends to be increased due to increase in function of an integrated circuit (IC) and memory capacitance, leading to increase in connection between logic circuits. Thus, the antenna ratio tends to be increased. In general, therefore, it is difficult to reduce deterioration or breaking of the gate oxide film which is caused by plasma charged particles by reducing the antenna ratio. Further, the gate oxide film tends to be reduced in thickness following high performance of the transistor, leading to a higher possibility for deterioration.

SUMMARY OF THE INVENTION

An object of the present invention is to provide a semiconductor device which can prevent a gate oxide film from deterioration or breaking also when an antenna ratio is increased.

Another object of the present invention is to provide a semiconductor device which can effectively remove a surge voltage applied to a gate electrode layer in a fabrication process.

Still another object of the present invention is to provide a semiconductor device which can prevent a gate oxide film from deterioration or breaking also when its thickness is reduced.

According to a first aspect of the present invention, a semiconductor device, which includes an internal circuit other than an initial input stage circuit having a field-effect transistor, comprises a gate electrode layer, a first wiring layer, and an impurity diffusion layer. The gate electrode layer is an element forming the field effect transistor of the internal circuit other than the initial input stage circuit. The first wiring layer is electrically connected with the gate electrode layer, for transmitting a circuit signal to the gate electrode layer. The impurity diffusion layer is interposed between the gate electrode layer and the first wiring layer, and forms a resistor and a diode. Preferably, the impurity diffusion layer may include a first conductivity type first impurity diffusion layer, and a second conductivity type second impurity diffusion layer which is connected in series with the first impurity diffusion layer. Preferably, the impurity diffusion layer may include a first conductivity type first impurity diffusion layer, and a second conductivity type second impurity diffusion layer which is connected in parallel with the first impurity diffusion layer. Preferably, a resistive layer consisting of a conductive film which is connected in series with the impurity diffusion layer may be further interposed between the gate electrode layer and the first wiring layer. Preferably, the first wiring layer may be formed by a metal wiring layer, and the metal wiring layer may be connected with the impurity diffusion layer through a pad layer which is formed on an upper surface of the impurity diffusion layer. Preferably, a second wiring layer which is formed above the first wiring layer through an insulating layer may be connected in parallel with a first resistive layer. Preferably, the first resistive layer may be positioned in the vicinity of the gate electrode layer.

In this semiconductor device, the impurity diffusion layer forming a resistor and a diode is interposed between the gate electrode layer and the first wiring layer, whereby plasma charged particles which are accumulated in the first wiring layer in plasma etching for patterning the first wiring layer are absorbed by the impurity diffusion layer. Thus, no surge voltage caused by the plasma charged particles is applied to the gate electrode layer which is electrically connected with the first wiring layer, whereby a gate oxide film positioned under the gate electrode layer is prevented from deterioration or breaking. This function is attained regardless of the antenna ratio, whereby the gate oxide film is prevented from deterioration or breaking also when the antenna ratio is at a high level. When the impurity diffusion layer is so formed as to include a first conductivity type first impurity diffusion layer and a second conductivity type second impurity diffusion layer which is connected in series with the first impurity diffusion layer, it is possible to cope with both of positive and negative surge voltages applied to the first wiring layer. When the impurity diffusion layer is so formed as to include a first conductivity type first impurity diffusion layer and a second conductivity type second impurity diffusion layer which is connected in parallel with the first impurity diffusion layer, on the other hand, the resistance of the impurity diffusion layer is further reduced, to increase a signal propagation velocity after completion of the processes. When a resistive layer consisting of a conductive film which is connected in series with the impurity diffusion layer is further interposed between the gate electrode layer and the first wiring layer, it is possible to increase the value of a series resistance by the conductive film having a small capacitance with respect to a substrate dissimilarly to the impurity diffusion layer, thereby suppressing delay in signal propagation velocity. When the first wiring layer is formed by a metal wiring layer and this metal wiring layer is connected with the impurity diffusion layer through a pad layer which is formed on an upper surface of the impurity diffusion layer, it is possible to prevent the metal wiring layer from being absorbed by the impurity diffusion layer and causing a leakage current. When a second wiring layer which is formed above the first wiring layer through an insulating layer is connected in parallel with the impurity diffusion layer, the value of a resistance between the first wiring layer and the gate electrode layer is further reduced. Thus, delay in signal propagation velocity is reduced. When the impurity diffusion layer forming a resistor and a diode is positioned in the vicinity of the gate electrode layer, plasma charged particles which are accumulated in the first wiring layer in patterning thereof are further readily absorbed by the impurity diffusion layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Figure 1:
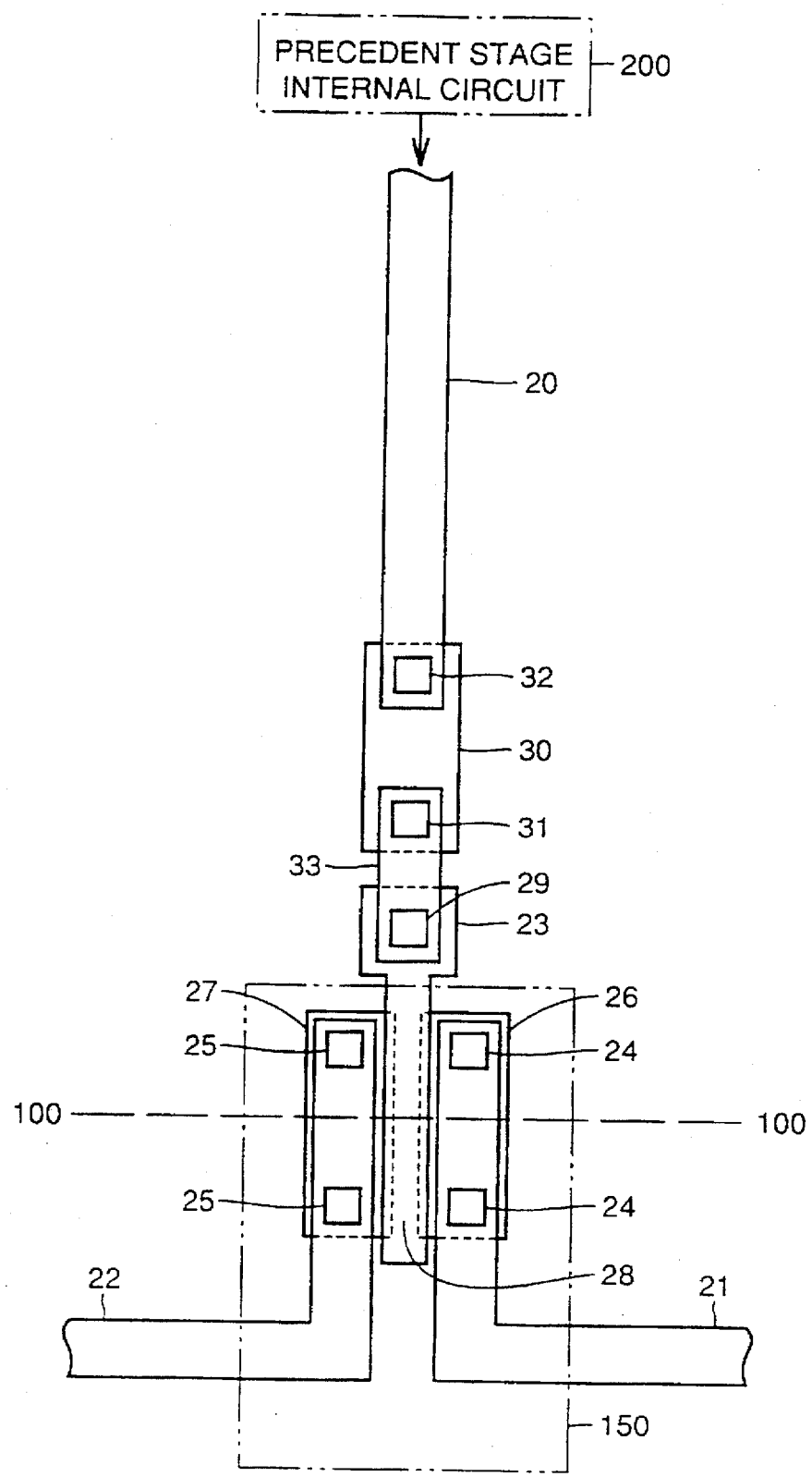
FIG. 1 is a plan view showing a plane pattern of a semiconductor device according to a first embodiment of the present invention.
Figure 2:
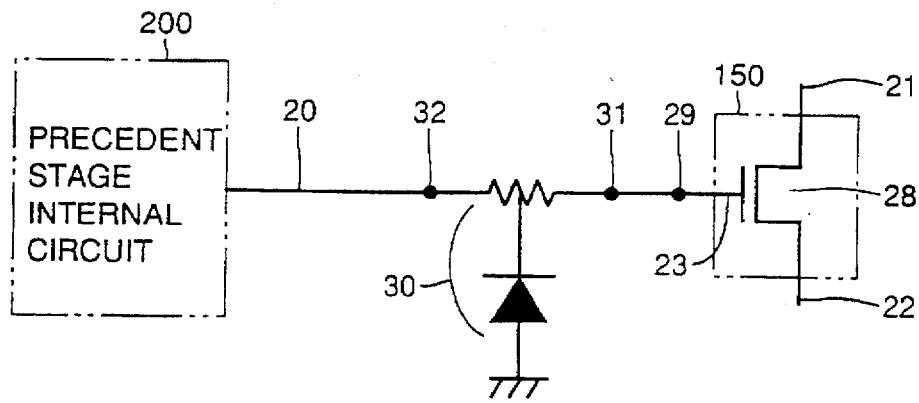
FIG. 2 is an equivalent circuit diagram of the semiconductor device according to the first embodiment shown in FIG. 1.
Figure 25:
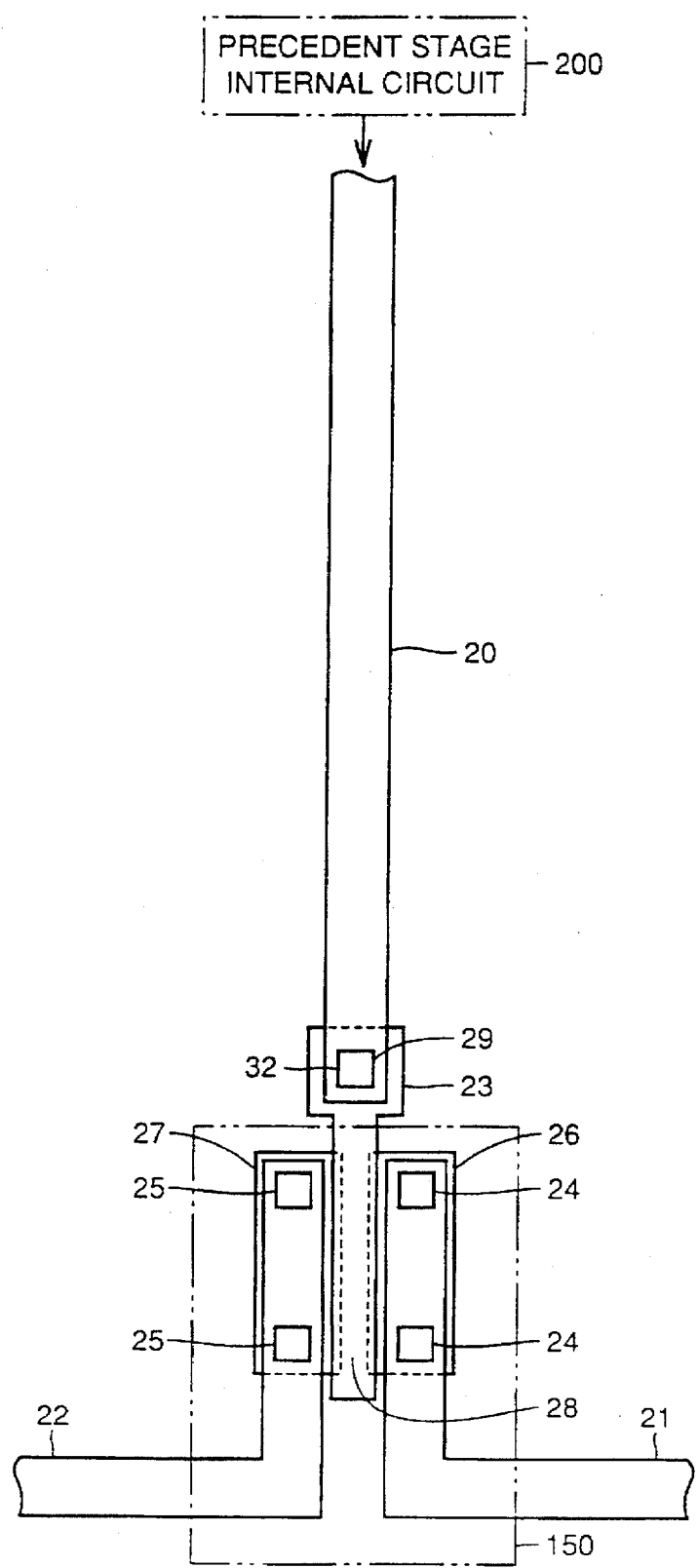
FIG. 25 is a plan view showing a plane pattern of a conventional internal circuit other than an initial input stage circuit.
Figure 27:
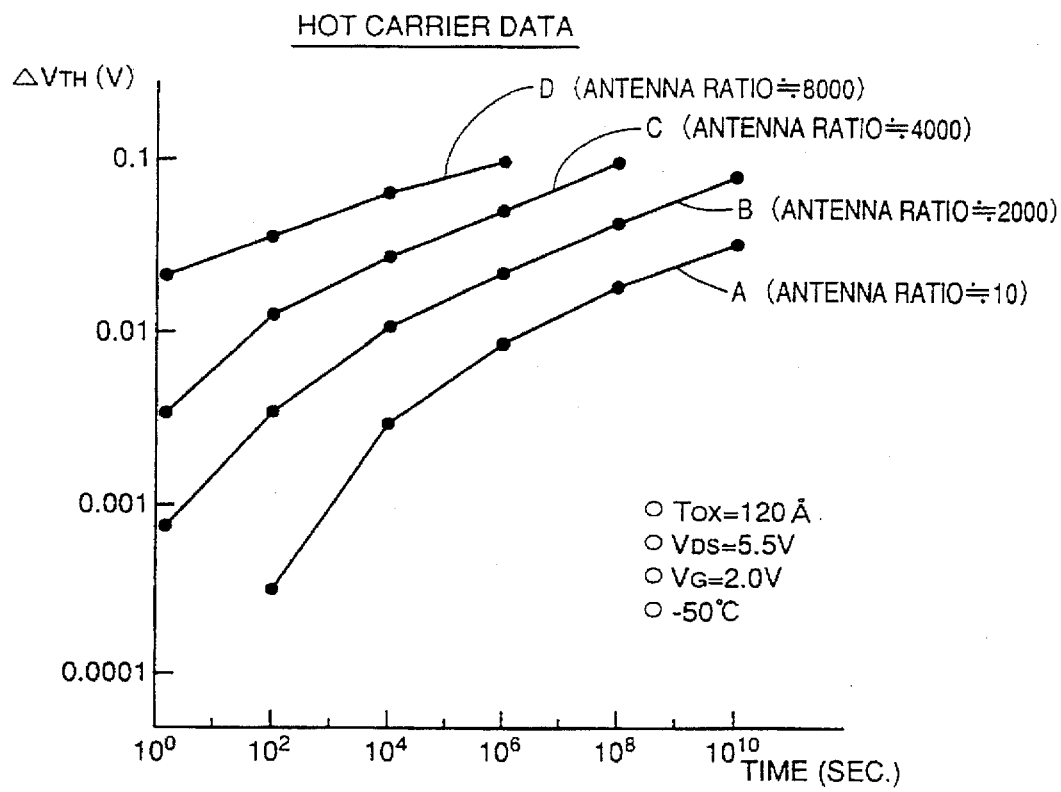
FIG. 27 illustrates fluctuation in threshold value of the conventional internal circuit under various antenna ratios.

Referring to FIGS. 1 and 2, an N-type diffusion layer 30 serving as a resistor and a diode is provided between a metal wire 20 which is connected with a precedent stage internal circuit 200 and a gate electrode layer 23 of an internal circuit 150 in a semiconductor device according to a first embodiment of the present invention. The N-type diffusion layer 30 is connected with the metal wire 20 which is formed by an aluminum wiring layer or the like through a contact hole 32. The N-type diffusion layer 30 is further connected with the gate electrode layer 23 by a metal wire 33 which is formed by an aluminum wiring layer or the like through contact holes 29 and 31. The remaining structure of this embodiment is similar to that of the prior art shown in FIG. 25.

In the semiconductor device according to the first embodiment, the N-type diffusion layer 30 forming a resistor and a diode is so provided as to absorb plasma charged particles which are accumulated in the metal wire 20 by plasma etching in patterning thereof. In more concrete terms, a ground potential is supplied from a substrate to the metal wire 20 through the N-type diffusion layer 30 forming a diode in patterning of the metal wire 20 as shown in FIG. 2, whereby plasma charged particles accumulated in the metal wire 20 disappear. The diode which is formed by the N-type diffusion layer 30 is particularly effective when minus plasma charged particles are accumulated in the metal wire 20.

When plasma charged particles are abruptly accumulated in the metal wire 20 by plasma etching in patterning thereof, it is possible to reduce the peak value of a surge voltage by the resistor which is formed by the N-type diffusion layer 30. If the N-type diffusion layer 30 forms only the diode with no resistor, the surge voltage is disadvantageously applied to the gate electrode layer 23 before disappearance of the accumulated charges, to deteriorate a gate oxide film. Thus, the resistor formed by the N-type diffusion layer 30 has an extremely effective function.

With reference to FIGS. 3 to 9, processes of fabricating the semiconductor device according to the first embodiment of the present invention are now described.

Figure 3:
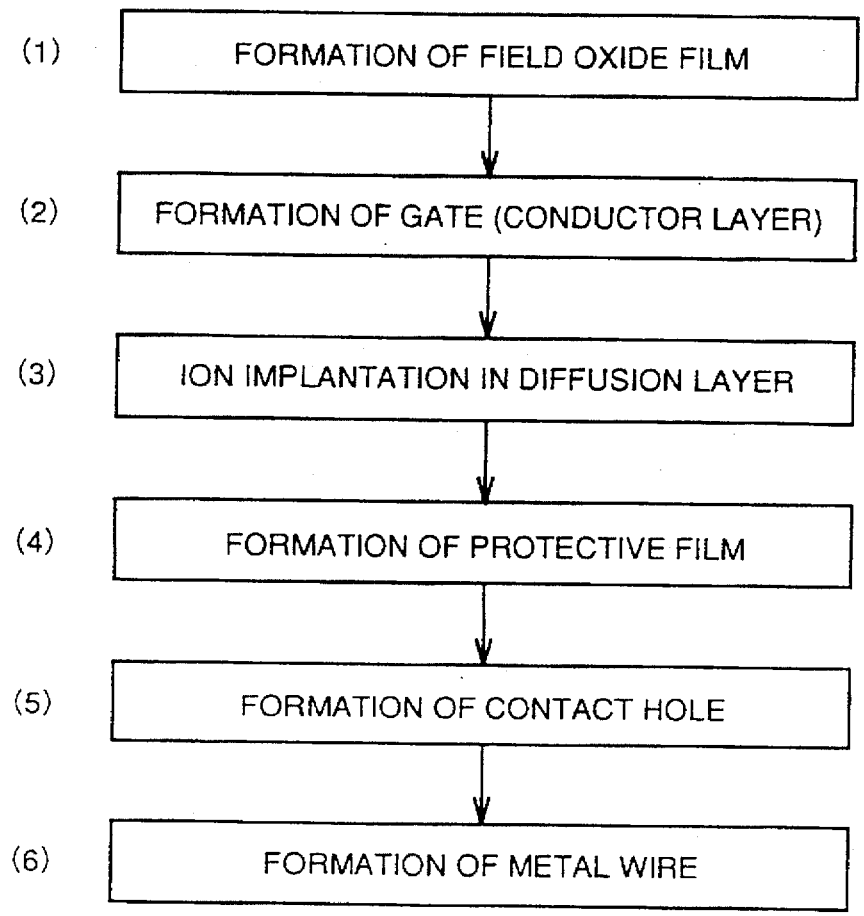
FIG. 3 is a flow chart for illustrating processes for fabricating a section of the semiconductor device taken along the line 100—100 in FIG. 1.
Figure 4:
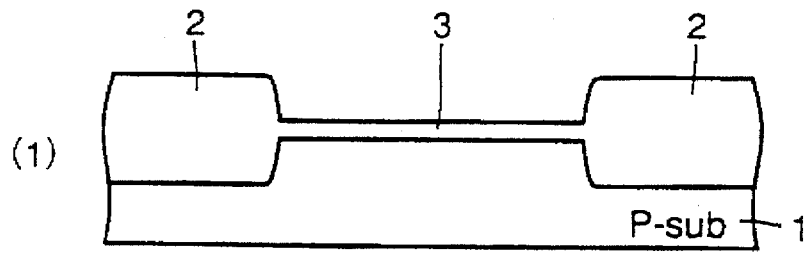
FIG. 4 is a sectional view corresponding to the process (1) shown in FIG. 3.
Figure 5:
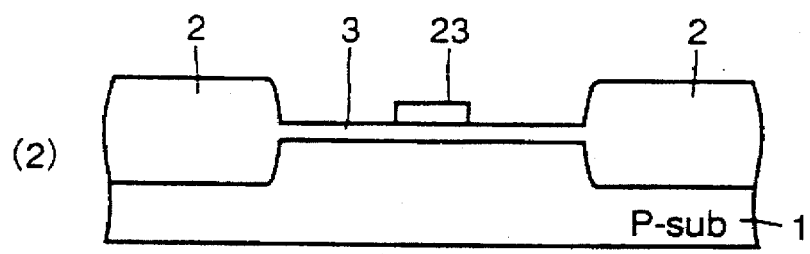
FIG. 5 is a sectional view corresponding to the process (2) shown in FIG. 3.

First, field oxide films 2 for element isolation is formed on a major surface of a P-type semiconductor substrate 1, as shown at (1) of FIG. 3 and in FIG. 4. A gate oxide film 3 is formed on a surface of an active region provided with no field oxide films 2. Thereafter a gate electrode layer 23 consisting of polysilicon or the like is formed as shown at (2) of FIG. 3 and in FIG. 5.

Figure 6:
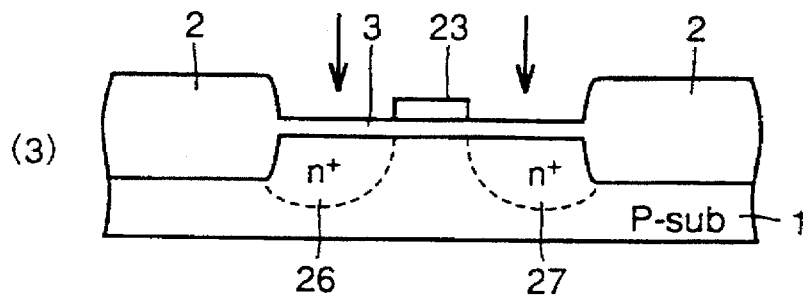
FIG. 6 is a sectional view corresponding to the process (3) shown in FIG. 3.

Then, the gate electrode layer 23 and the field oxide films 2 are employed as masks for ion-implanting an impurity into the P-type semiconductor substrate 1, thereby forming source/drain regions 26 and 27, as shown at (3) of FIG. 3 and in FIG. 6. This ion implantation is simultaneously carried out on a region to be provided with the N-type diffusion layer 30 shown in FIG. 1, thereby forming the N-type diffusion layer 30 simultaneously with the source/drain regions 26 and 27. Therefore, the fabrication processes are not complicated by provision of the N-type diffusion layer 30 in this embodiment.

Figure 7:
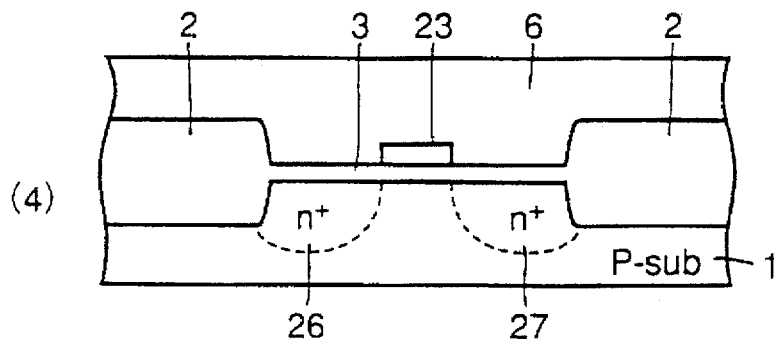
FIG. 7 is a sectional view corresponding to the process (4) shown in FIG. 3.
Figure 8:
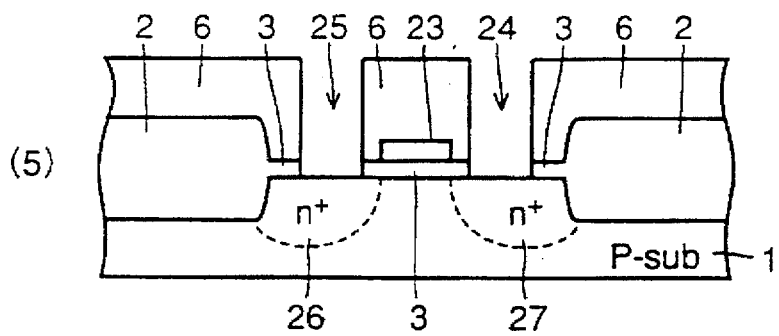
FIG. 8 is a sectional view corresponding to the process (5) shown in FIG. 3.

Thereafter a protective film 6 is formed on the overall surface, as shown at (4) of FIG. 3 and in FIG. 7. Then, contact holes 24 and 25 are formed in the protective film 6, as shown at (5) of FIG. 3 and in FIG. 8.

Figure 9:
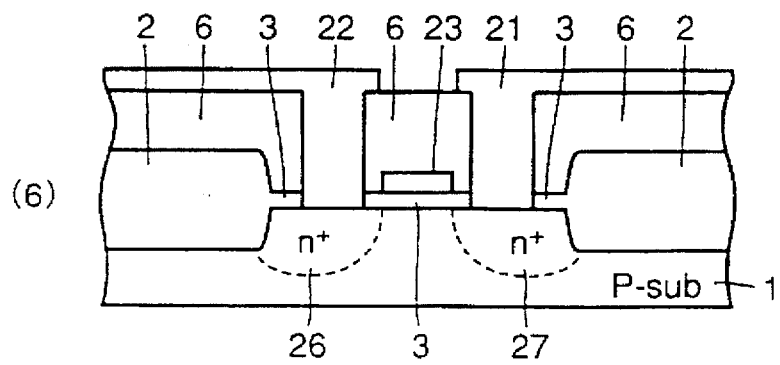
FIG. 9 is a sectional view corresponding to the process (6) shown in FIG. 3.

Finally, a metal layer (not shown) of aluminum or the like is formed on the overall surface and subjected to plasma dry etching, thereby forming metal wires 21 and 22, as shown at (6) of FIG. 3 and in FIG. 9. The metal wires 20 and 33 shown in FIG. 1 are formed simultaneously with the metal wires 21 and 22.

Figure 10:
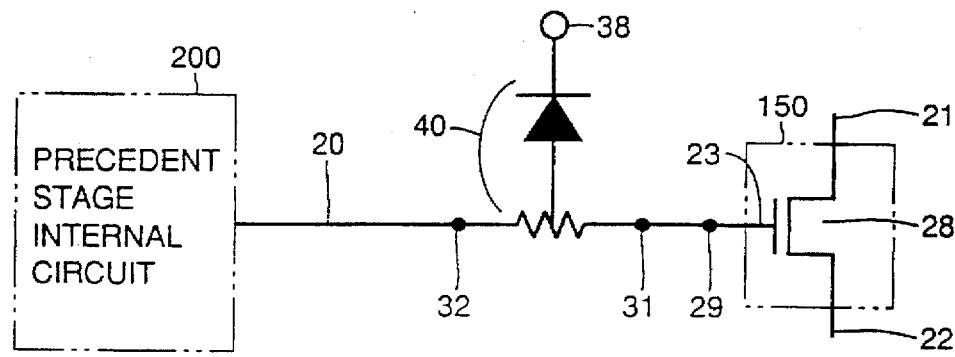
FIG. 10 is an equivalent circuit diagram showing a semiconductor device according to a second embodiment of the present invention.

Referring to FIG. 10 showing a semiconductor device according to a second embodiment of the present invention, a P-type diffusion layer 40 is employed in place of the N-type diffusion layer 30 of the first embodiment shown in FIGS. 1 and 2. A plane pattern of the semiconductor device according to the second embodiment is similar to that of the first embodiment shown in FIG. 1, except that the P-type diffusion layer 40 is formed in an N-type well which is supplied with a source voltage Vcc. Therefore, an equivalent circuit of this semiconductor device is in such a structure that a Vcc power source 38 is connected to the P-type diffusion layer 40 forming a resistor and a diode, as shown in FIG. 10. In the semiconductor device according to the second embodiment having the aforementioned structure, plasma charged particles which are accumulated in a metal wire 20 by plasma etching in patterning thereof are extracted to the Vcc power source 38 particularly when a plus surge voltage is applied. Thus, it is possible to prevent plus charging. The P-type diffusion layer 40 also forms a resistor, whereby it is possible to suppress the peak value of a surge voltage which is abruptly applied to the metal wire 20 in patterning thereof by the resistor.

Figure 12:
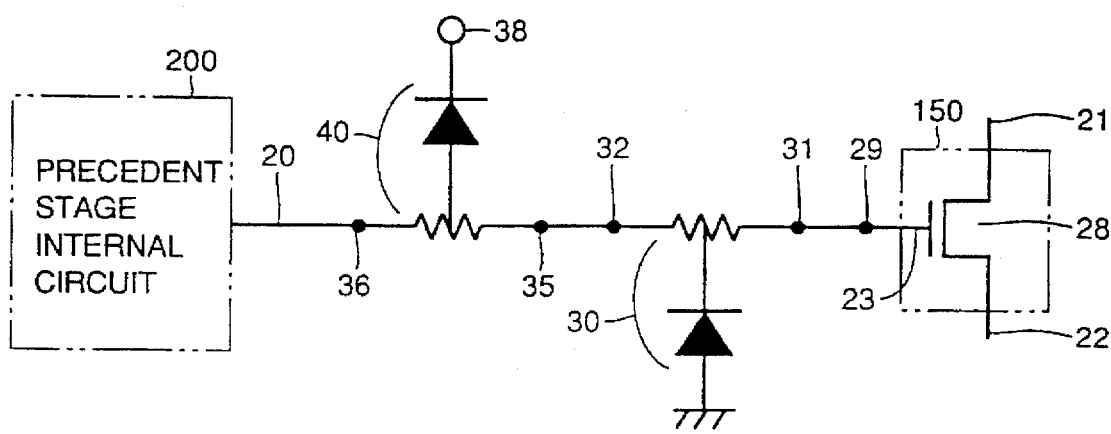
FIG. 12 is an equivalent circuit diagram of the semiconductor device according to the third embodiment shown in FIG. 11.
Figure 11:
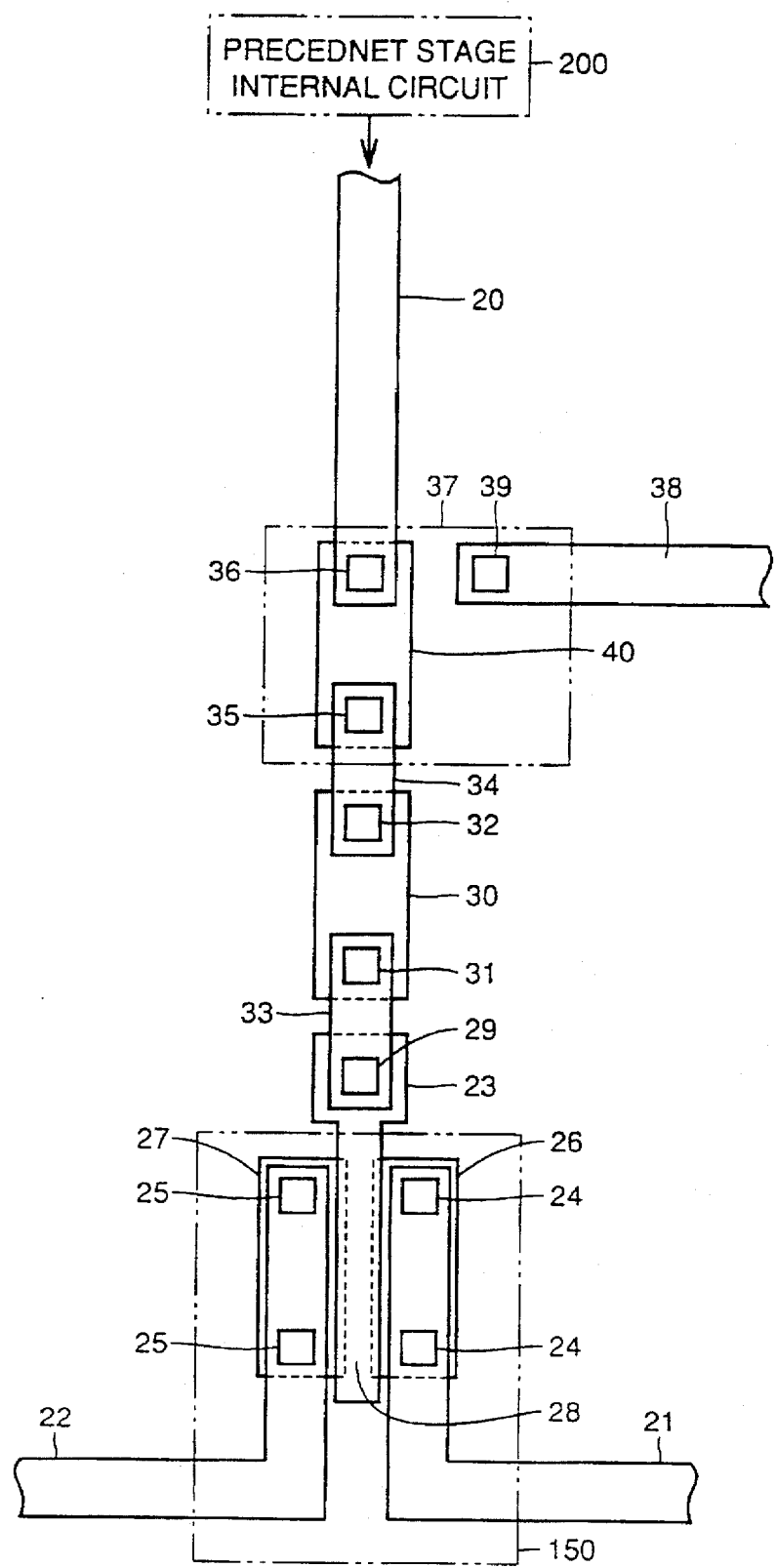
FIG. 11 is a plan view showing a plane pattern of a semiconductor device according to a third embodiment of the present invention.

Referring to FIGS. 11 and 12 showing a semiconductor device according to a third embodiment of the present invention, an N-type diffusion layer 30 and a P-type diffusion layer 40 are connected in series with each other. Thus, it is possible to reliably absorb both of plus and minus charges which are accumulated in a metal wire 20. In more concrete terms, the P-type diffusion layer 40 is formed at a prescribed distance from the N-type diffusion layer 30, as shown in FIG. 11. The P-type diffusion layer 40, which is formed in an N-type well region 37, is connected with a metal wire 20 through a contact hole 36. This P-type diffusion layer 40 is connected with the N-type diffusion layer 30 by a metal wire 34 through contact holes 32 and 35. The N-type well region 37 is connected with a metal wire 38, which is supplied with a source voltage Vcc through a contact hole 39. FIG. 12 is an equivalent circuit diagram of this semiconductor device. An effect of the semiconductor device according to the third embodiment having the aforementioned structure is now described in detail.

Figure 13:
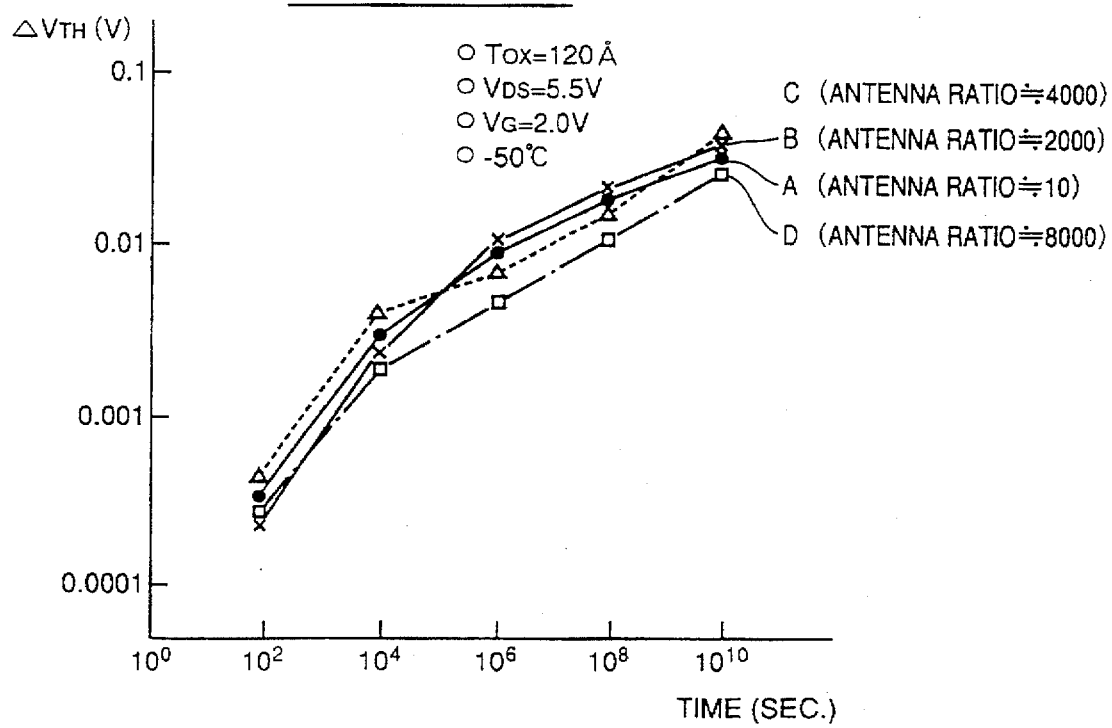
FIG. 13 illustrates fluctuation in threshold voltage of the semiconductor device according to the third embodiment shown in FIGS. 11 and 12 under various antenna ratios.

Referring to FIG. 13, an experiment was made under conditions of a thickness ($T_{OX}$) of 120 Å of a gate oxide film, a voltage ($V_{DS}$) Of 5.5 V across source and drain regions, a gate voltage ($V_G$) of 2.0 V, and an experimental temperature of −50° C. It is understood from FIG. 13 that fluctuation values $\Delta V_{TH}$ of threshold voltages substantially remained unchanged under four types of antenna ratios of 10, 2000, 4000 and 8000 in the third embodiment. Namely, it is understood that plasma charged particles which are accumulated in the metal wire 20 are effectively absorbed in the structure of the third embodiment, with no regard to the antenna ratio. In other words, it is possible to effectively absorb plasma charged particles which are accumulated in the metal wire 20 also when the antenna ratio is increased, dissimilarly to the prior art.

Figure 14:
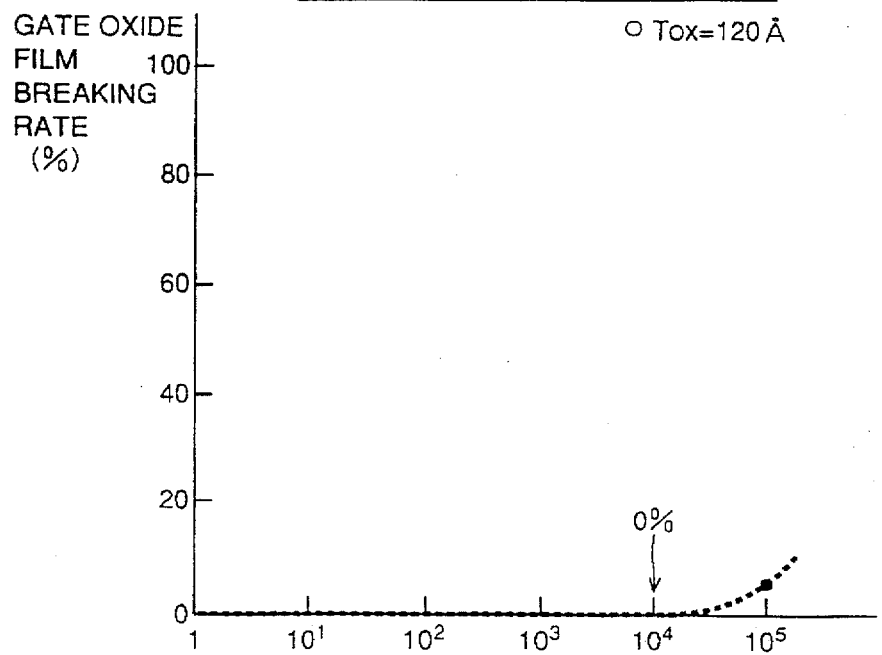
FIG. 14 illustrates a relation between the antenna ratio and a gate oxide film breaking rate in the semiconductor device according to the third embodiment shown in FIGS. 11 and 12.
Figure 28:
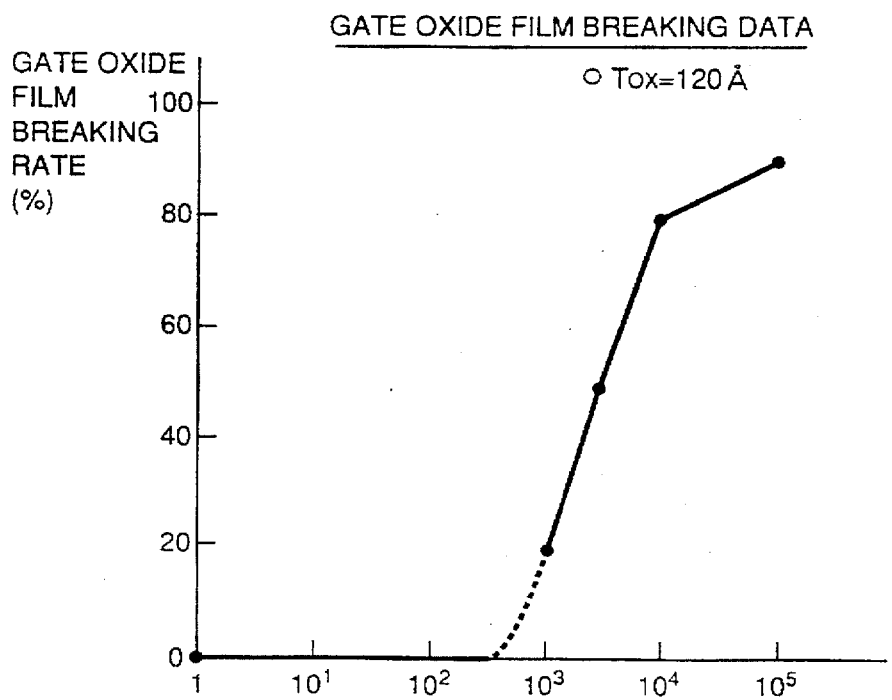
FIG. 28 illustrates a relation between the antenna ratio and a gate oxide film breaking rate in the conventional internal circuit.

Referring to FIG. 14, another experiment was made on a gate oxide film having a thickness ($T_{OX}$) of 120 Å, which was regarded as being broken when a leakage current exceeded 1 μA. It is understood from FIG. 14 that the breaking rate of this gate oxide film, which was 0% at an antenna ratio of $10^4$, was improved as compared with that of the prior art shown in FIG. 28.

Figure 15:
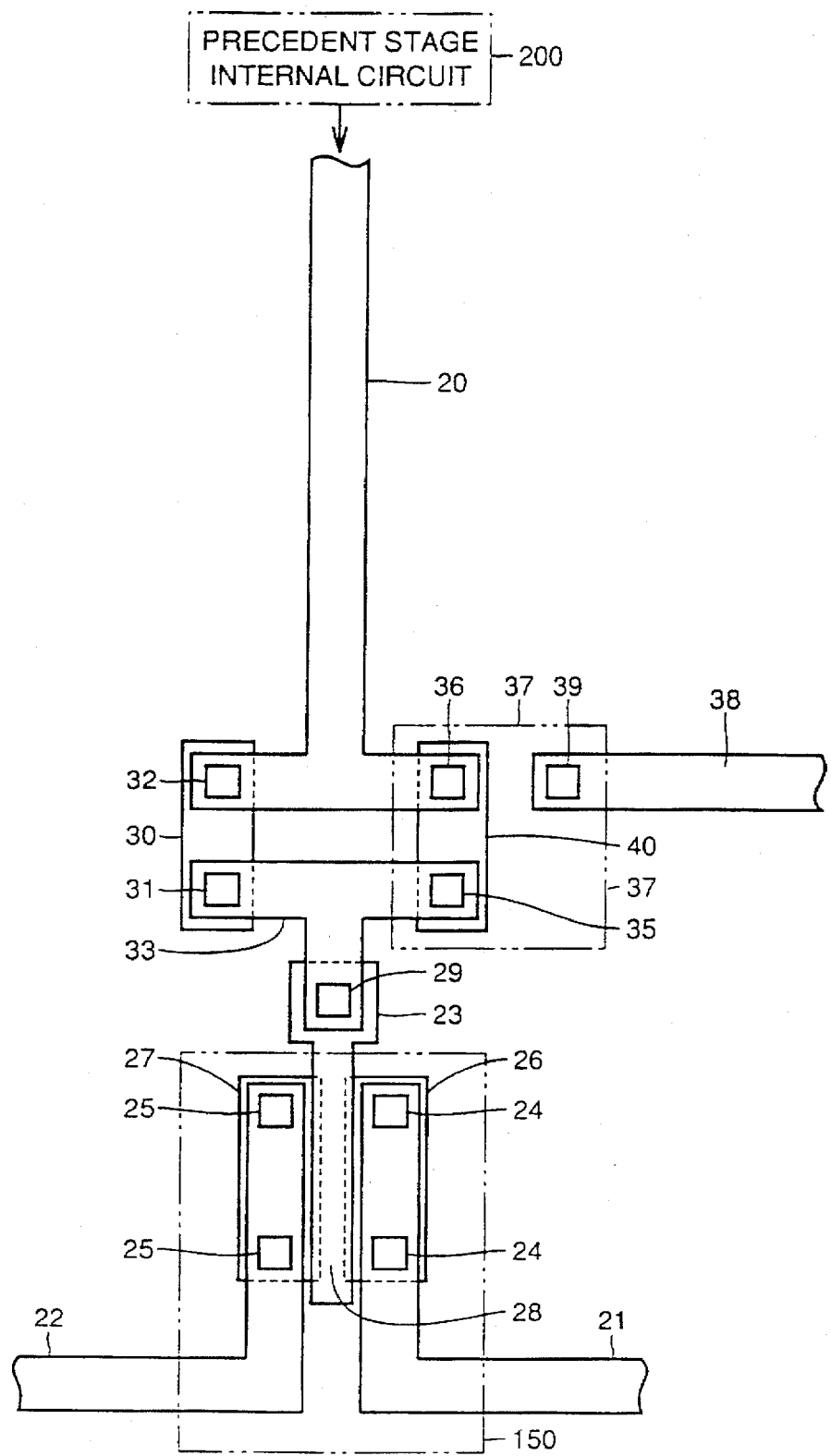
FIG. 15 is a plan view showing a plane pattern of a semiconductor device according to a fourth embodiment of the present invention.
Figure 16:
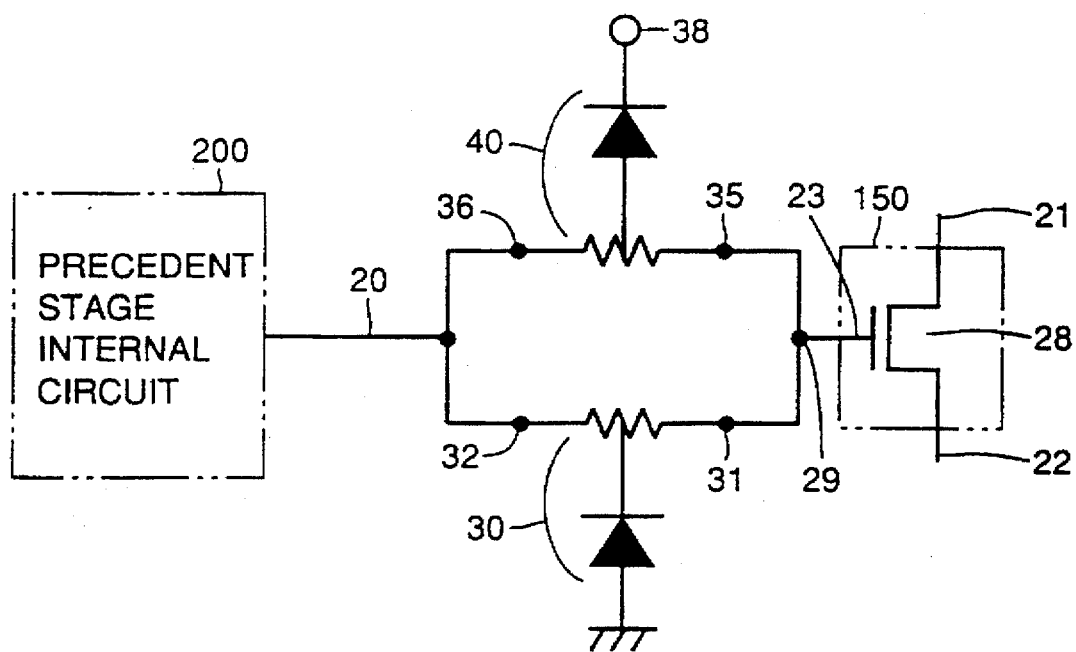
FIG. 16 is an equivalent circuit diagram of the semiconductor device according to the fourth embodiment shown in FIG. 15.

Referring to FIGS. 15 and 16 showing a semiconductor device according to a fourth embodiment of the present invention, an N-type diffusion layer 30 and a P-type diffusion layer 40 are connected in parallel with each other between a metal wire 20 and a gate electrode layer 23. Due to this structure, it is possible to effectively absorb both of plus and minus charges which are accumulated in the metal wire 20, similarly to the third embodiment. According to the fourth embodiment, further, the N-type diffusion layer 30 and the P-type diffusion layer 40 are provided in parallel with each other, whereby it is possible to reduce the value of a resistance formed by the N-type and P-type diffusion layers 30 and 40. Thus, it is possible to increase a signal propagation velocity.

In each structure of the third and fourth embodiments, a metal wire may be formed above the N-type diffusion layer 30 or the P-type diffusion layer 40 to be connected in parallel with the diffusion layer 30 or 40 in a later process, for further reducing the value of the resistance formed by the N-type and P-type diffusion layers 30 and 40.

Figure 17:
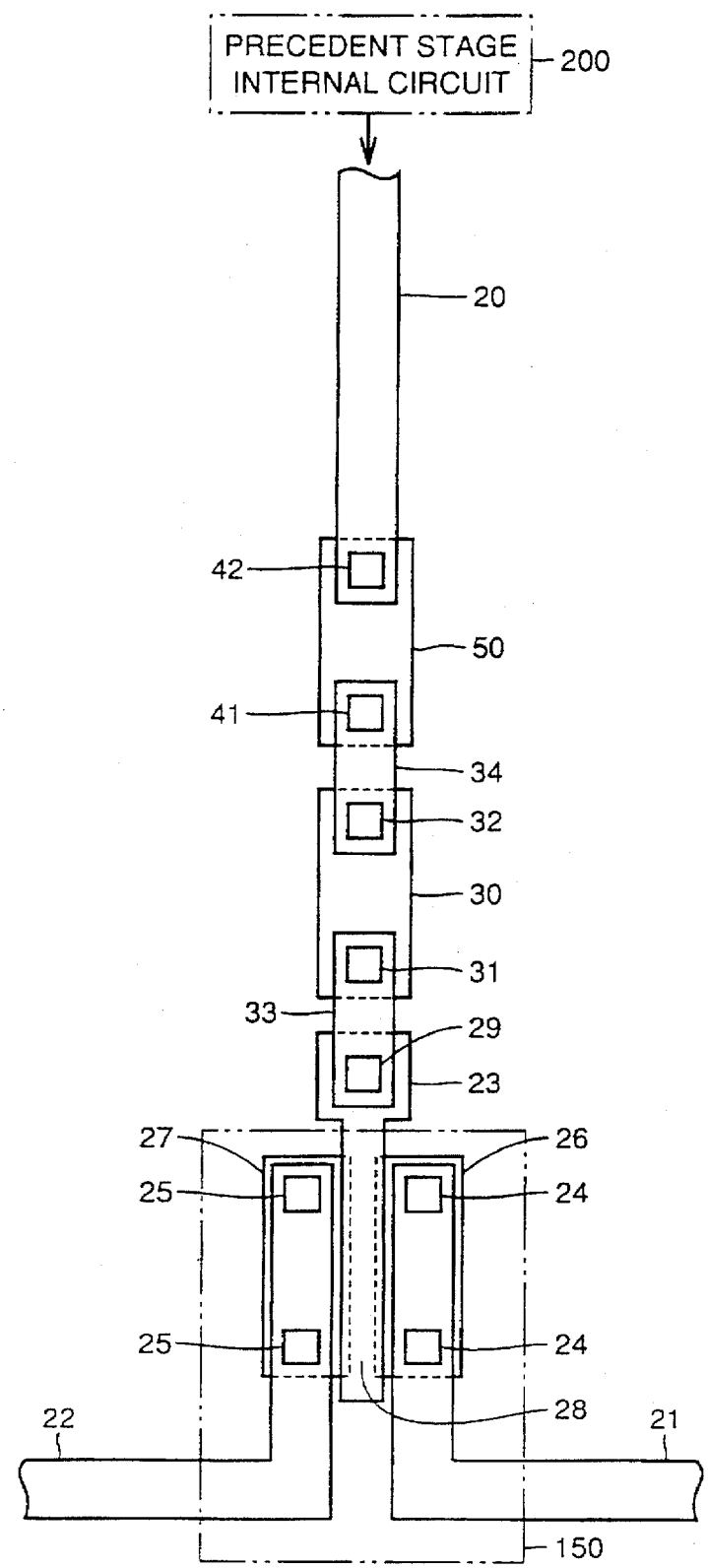
FIG. 17 is a plan view showing a plane pattern of a semiconductor device according to a fifth embodiment of the present invention.

Referring to FIG. 17 showing a semiconductor device according to a fifth embodiment of the present invention, a conductor layer 50 which is formed by a polysilicon film or the like is provided to be connected in series with an N-type diffusion layer 30. Due to this structure, it is possible to increase only the value of a series resistance without increasing capacitance. Thus, it is possible to further reduce delay in signal propagation. If the resistance value of the N-type diffusion layer 30 is increased in order to increase the value of the series resistance, junction capacitance thereof is disadvantageously increased, to increase delay in signal propagation. According to the fifth embodiment, the resistance value of the series resistance is increased by the conductor layer 50 which is formed by a polysilicon film or the like, whereby the junction capacitance of the N-type diffusion layer 30 is not increased and hence it is possible to reduce delay in signal propagation.

Figure 18:
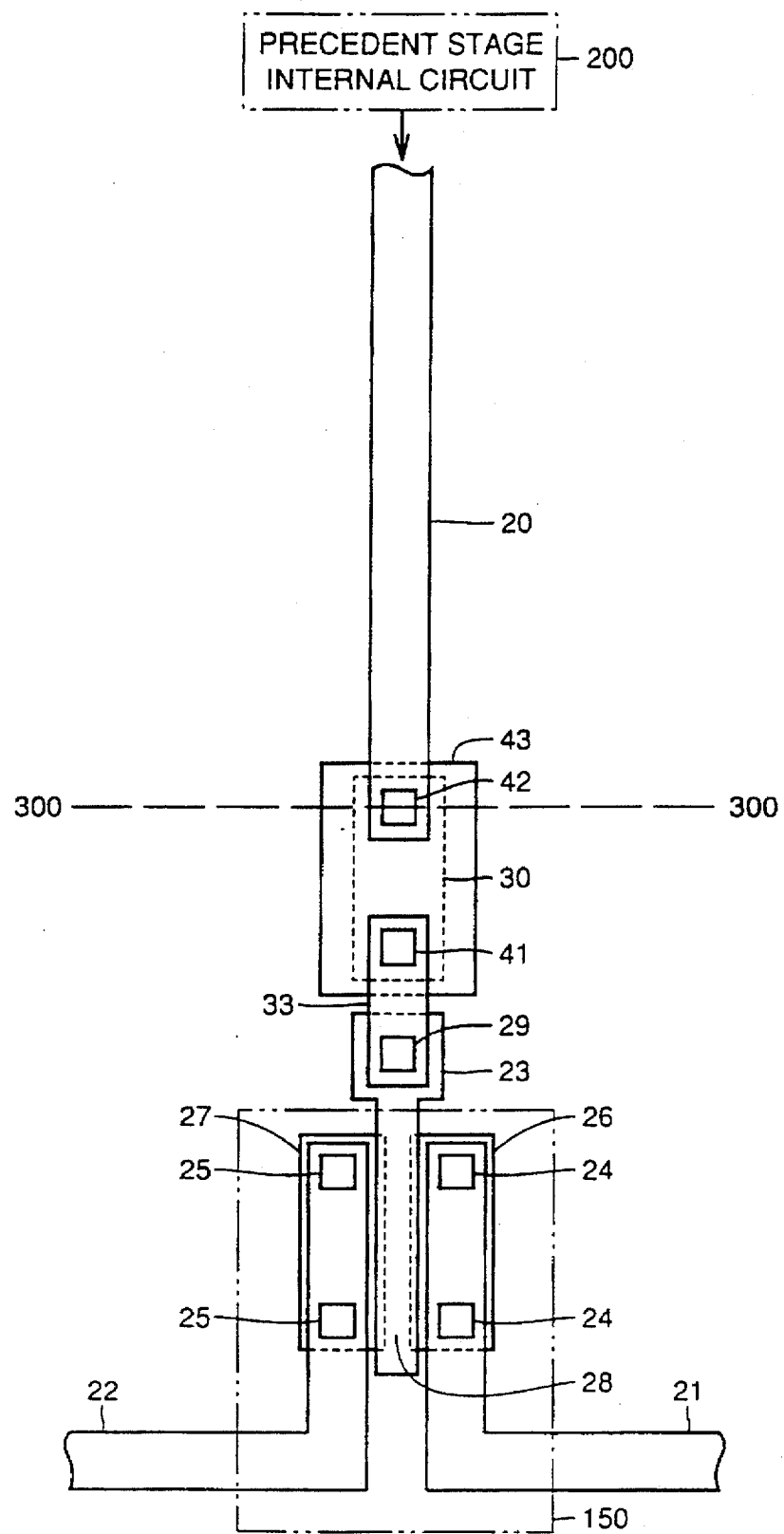
FIG. 18 is a plan view showing a plane pattern of a semiconductor device according to a sixth embodiment of the present invention.
Figure 19:
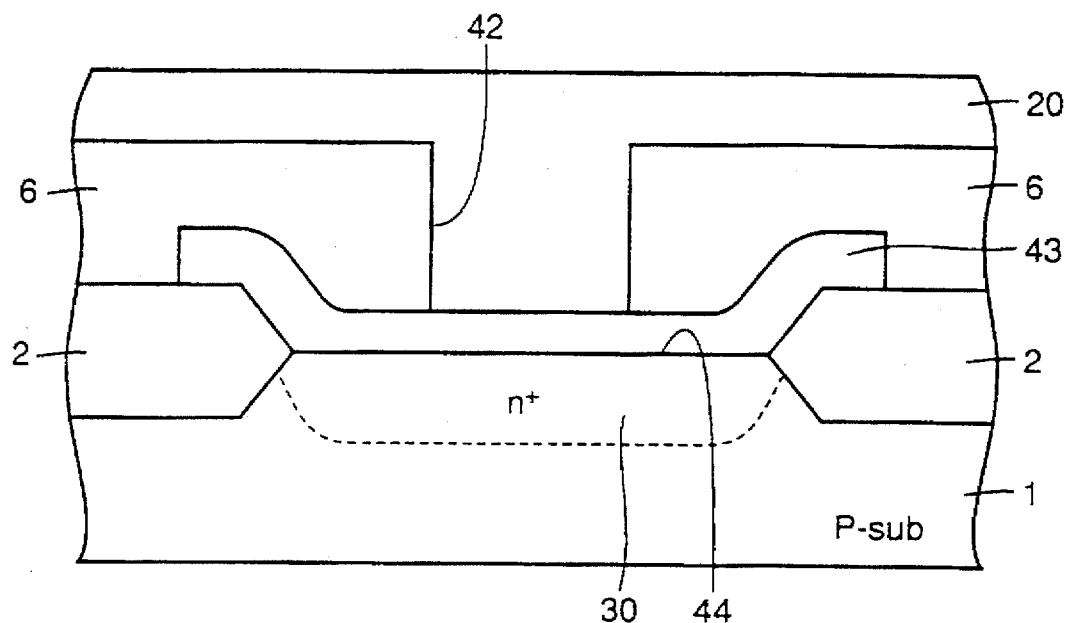
FIG. 19 is a sectional view of the semiconductor device according to the sixth embodiment taken along the line 300—300 in FIG. 15.
Figure 20:
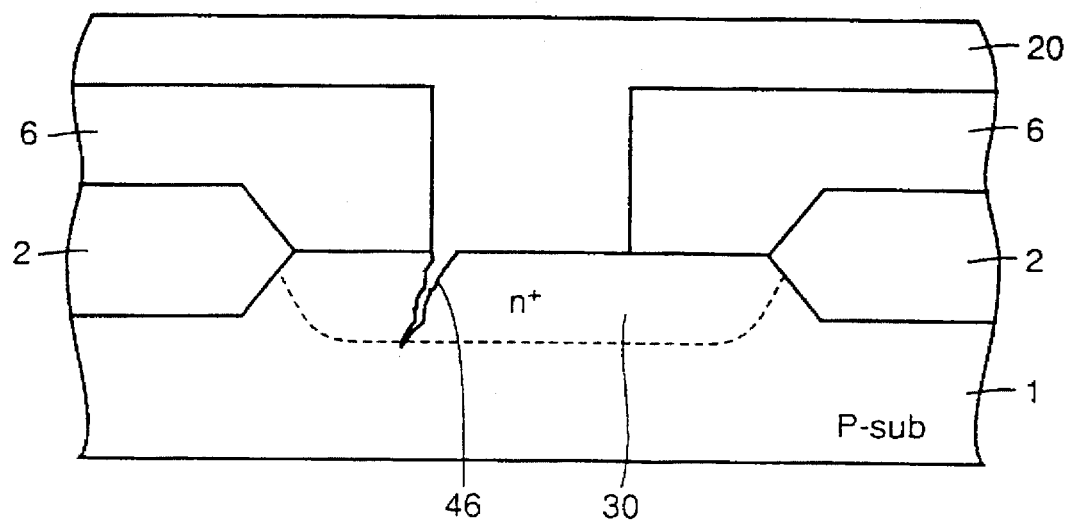
FIG. 20 is a sectional view for illustrating inconvenience caused when no conductive layer is provided in the semiconductor device according to the sixth embodiment shown in FIG. 15.

Referring to FIGS. 18 and 19 showing a semiconductor device according to a sixth embodiment of the present invention, an N-type diffusion layer 30 is connected with metal wires 20 and 33 through a conductor layer 43 which consists of polysilicon or the like. In more concrete terms, the conductor layer 43 which is formed by a polysilicon film or the like is provided to be in contact with a direct contact part 44 on an upper surface of the N-type diffusion layer 30, and the metal wires 20 and 33 are connected onto an upper surface of the conductor layer 43 through contact holes 42 and 41 respectively. According to the sixth embodiment having the aforementioned structure, it is possible to prevent the metal wire 20, which is formed by an aluminum wiring layer or the like, from being absorbed in the N-type diffusion layer 30 and forming an aluminum spike 46 as shown in FIG. 20. Thus, it is possible to effectively prevent a leakage current caused by such an aluminum spike 46 according to the sixth embodiment. Other effects of this embodiment are similar to those of the first embodiment.

Figure 21:
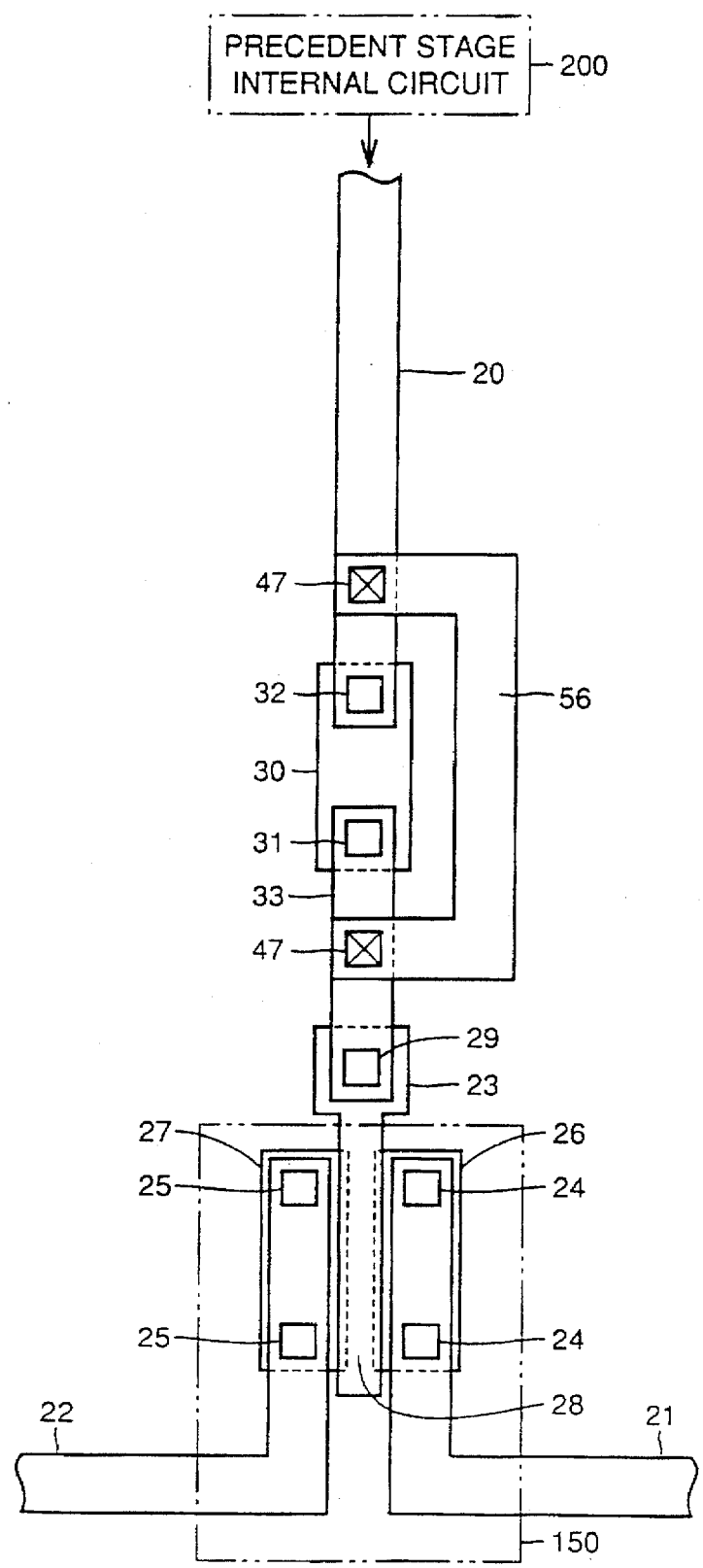
FIG. 21 is a plan view showing a plane pattern of a semiconductor device according to a seventh embodiment of the present invention.
Figure 22:
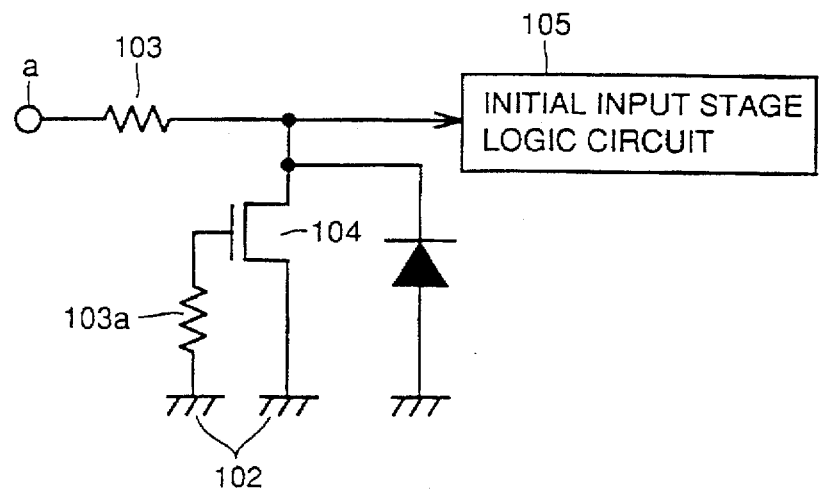
FIG. 22 is an equivalent circuit diagram showing a conventional NMOS transistor type input protection circuit which is connected to an initial input stage logic circuit.
Figure 23:
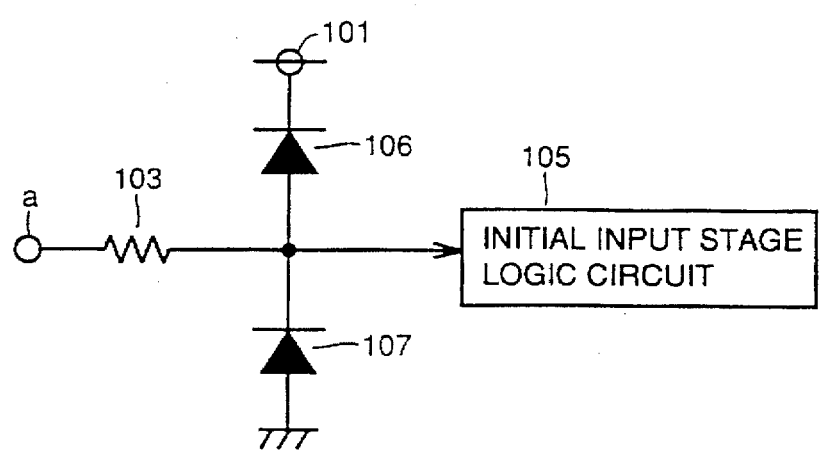
FIG. 23 is an equivalent circuit diagram showing a conventional diode type input protection circuit which is employed for an initial input stage logic circuit.
Figure 26:
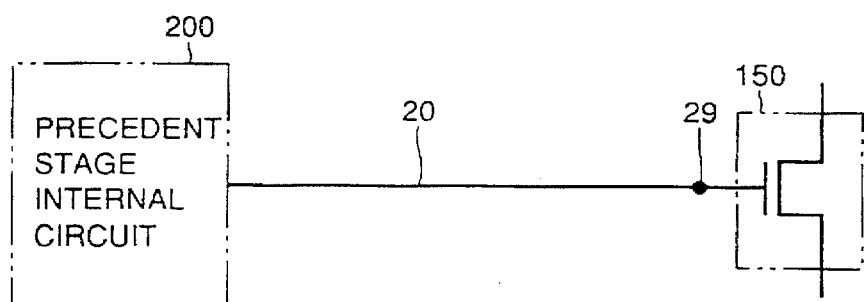
FIG. 26 is an equivalent circuit diagram of the conventional internal circuit shown in FIG. 25.
Figure 24:
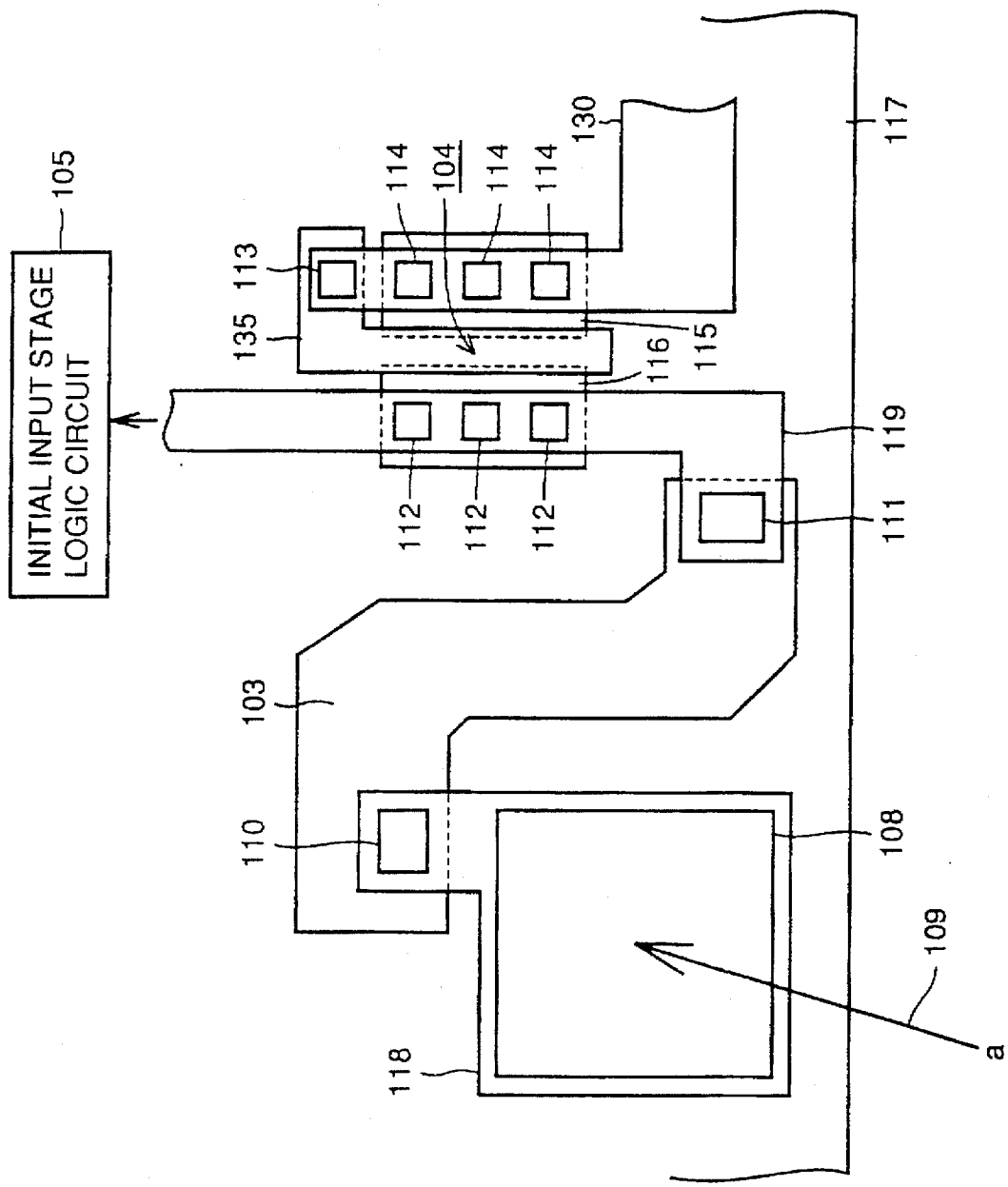
FIG. 24 is a plan view showing a plane pattern of the NMOS transistor type input protection circuit shown in FIG. 22.

Referring to FIG. 21 showing a semiconductor device according to a seventh embodiment of the present invention, metal wires 20 and 33 are connected with each other by a second metal wire 56 which is formed by an aluminum wiring layer or the like positioned above the metal wire 20, in addition to the structure of the first embodiment shown in FIG. 1. An N-type diffusion layer 30 forming a resistor and a diode is adapted to absorb plasma charged particles which are accumulated in the metal wire 20, having a large antenna ratio, in formation thereof. When the plasma charged particles accumulated in the metal wire 20 are absorbed, therefore, the N-type diffusion layer 30 is not required any more. In this case, it is possible to reduce the value of a resistance across the metal wires 20 and 33 by shorting the same through the second metal wire 56 which is formed in a later step. Thus, it is possible to increase a signal propagation velocity.

Each of the semiconductor devices according to the first to seventh embodiments is particularly effective when the antenna ratio, which has been problematic in the prior art, is at least 5. In each of the semiconductor devices according to the first to seventh embodiments, further, the protective circuit formed by the N-type diffusion layer 30 or the like is preferably provided in the vicinity of the gate electrode layer 23, for reducing the wiring length of the metal wire 33 in which plasma charged particles are accumulated similarly to the metal wire 20. It is possible to reduce the amount of the plasma charged particles which are accumulated in the metal wire 33, by reducing its length. Consequently, no particular problem is caused even if the plasma charged particles which are accumulated in the metal wire 33 flow to the gate electrode layer 23. In each of the semiconductor devices according to the first to seventh embodiments, in addition, the metal wire 20 may be connected with the precedent stage internal circuit 200 directly or through another conductive or metal layer.

According to the inventive semiconductor device, as hereinabove described, an impurity diffusion layer forming a resistor and a diode is interposed between the gate electrode layer and the first wiring layer, whereby it is possible to absorb plasma charged particles which may be accumulated in the first wiring layer by plasma etching in patterning thereof by the impurity diffusion layer. Therefore, no surge voltage is applied to the gate oxide film which is positioned under the gate electrode layer also when the antenna ratio is at a high level, whereby the gate oxide film can be effectively prevented from deterioration or breaking. When the impurity diffusion layer is so formed as to include a first conductivity type first impurity diffusion layer and a second conductivity type second impurity diffusion layer which is connected in series with the first impurity diffusion layer, it is possible to cope with both of plus and minus charges accumulated in the first wiring layer. When the impurity diffusion layer is so formed as to include a first conductivity type first impurity diffusion layer and a second conductivity type second impurity diffusion layer which is connected in parallel with the first impurity diffusion layer, on the other hand, it is possible to reduce the value of a resistance formed by the first and second impurity diffusion layers. Thus, it is possible to prevent delay in signal propagation velocity. When a resistive layer formed by a conductive film which is connected in series with the impurity diffusion layer is interposed between the gate electrode layer and the first wiring layer, further, it is possible to suppress increase in capacitance as compared with a case of increasing the value of a series resistance by increasing the resistance of the impurity diffusion layer. Thus, it is possible to minimize delay in signal propagation velocity. When the first wiring layer is formed by a metal wiring layer, it is possible to prevent the metal wiring layer from being absorbed by the impurity diffusion layer and causing a leakage current by connecting the metal wiring layer with the impurity diffusion layer through a pad layer which is formed on the upper surface of the impurity diffusion layer. When a second wiring layer which is formed above the first wiring layer through an insulating layer is connected in parallel with the impurity diffusion layer, further, it is possible to increase the signal propagation velocity. When the impurity diffusion layer is positioned in the vicinity of the gate electrode layer, further, it is possible to reduce the length of the wiring layer for connecting the impurity diffusion layer and the gate electrode layer with each other, thereby further reducing the amount of plasma charged particles which may flow to the gate electrode layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including an internal circuit other than an initial input stage circuit having a field-effect transistor, said semiconductor device comprising:

a gate electrode layer forming said field-effect transistor of said internal circuit other than said initial input stage circuit;

a first wiring layer being electrically connected with said gate electrode layer for transmitting a circuit signal to said gate electrode layer; and an impurity diffusion layer, being interposed between said gate electrode layer and said first wiring layer, forming a resistor and a diode.

2. A semiconductor device in accordance with claim 1, wherein said impurity diffusion layer includes:

a first conductivity type first impurity diffusion layer, and a second conductivity type second impurity diffusion layer being connected in series with said first impurity diffusion layer.

3. A semiconductor device in accordance with claim 2, wherein said first impurity diffusion layer is formed on a major surface of a second conductivity type semiconductor substrate, and said second impurity diffusion layer is formed on a major surface of a first conductivity type well region, said semiconductor substrate being supplied with a ground potential, said well region being supplied with a source potential.

4. A semiconductor device in accordance with claim 1, wherein said impurity diffusion layer includes:

a first conductivity type first impurity diffusion layer, and a second conductivity type second impurity diffusion layer being connected in parallel with said first impurity diffusion layer.

5. A semiconductor device in accordance with claim 4, wherein said first impurity diffusion layer is formed on a major surface of a second conductivity type semiconductor substrate, and said second impurity diffusion layer is formed on a major surface of a first conductivity type well region, said semiconductor substrate being supplied with a ground potential, said well region being supplied with a source potential.

6. A semiconductor device in accordance with claim 1, wherein a resistive layer consisting of a conductive film being connected in series with said impurity diffusion layer is further interposed between said gate electrode layer and said first wiring layer.

7. A semiconductor device in accordance with claim 1, wherein said first wiring layer is a metal wiring layer, said metal wiring layer being connected with said impurity diffusion layer through a pad layer being formed on an upper surface of said impurity diffusion layer.

8. A semiconductor device in accordance with claim 7, wherein said pad layer consists of a polysilicon film.

9. A semiconductor device in accordance with claim 1, wherein said impurity diffusion layer and said gate electrode layer are connected with each other by a second wiring layer being formed by the same material as that for said first wiring layer.

10. A semiconductor device in accordance with claim 1, wherein a second wiring layer being formed above said first wiring layer through an insulating layer is connected in parallel with said impurity diffusion layer.

11. A semiconductor device in accordance with claim 2, wherein a second wiring layer being formed above said first wiring layer through an insulating layer is connected in parallel with either one of said first and second impurity diffusion layers.

12. A semiconductor device in accordance with claim 4, wherein a second wiring layer being formed above said first wiring layer through an insulating layer is connected in parallel with either one of said first and second impurity diffusion layers.

13. A semiconductor device in accordance with claim 1, wherein the sum of plane areas of a region of said gate electrode layer other than a portion corresponding to a channel region being positioned under said gate electrode layer and said first wiring layer is at least 5 assuming that a plane area of said channel region is 1.

14. A semiconductor device in accordance with claim 1, wherein said impurity diffusion layer is positioned in the vicinity of said gate electrode layer.

* * * * *